(12) United States Patent
Priel et al.

(10) Patent No.: US 8,698,552 B2
(45) Date of Patent: Apr. 15, 2014

(54) RESPONSE TO WEAROUT IN AN ELECTRONIC DEVICE

(75) Inventors: Michael Priel, Hertzelia (IL); Anton Rozen, Gedera (IL); Yossi Shoshany, Gan Yavne (IL)

(73) Assignee: Freescale Semiconductor, Inc., Austin, TX (US)

( * ) Notice: Subject to any disclaimer, the term of this patent is extended or adjusted under 35 U.S.C. 154(b) by 31 days.

(21) Appl. No.: 13/500,700

(22) PCT Filed: Nov. 6, 2009

(86) PCT No.: PCT/IB2009/054942
§ 371 (c)(1),
(2), (4) Date: Apr. 6, 2012

(87) PCT Pub. No.: WO2011/055169
PCT Pub. Date: May 12, 2011

(65) Prior Publication Data
US 2012/0206183 A1    Aug. 16, 2012

(51) Int. Cl.
*G05F 1/10* (2006.01)

(52) U.S. Cl.
USPC .......................................... 327/540; 327/538

(58) Field of Classification Search
USPC ......... 327/538, 540, 530, 512, 306, 317, 362; 324/750.01, 762.01, 762.09
See application file for complete search history.

(56) References Cited

U.S. PATENT DOCUMENTS

| | | | |
|---|---|---|---|
| 6,476,632 B1 | 11/2002 | La Rosa et al. | |
| 6,653,856 B1 | 11/2003 | Liu | |
| 6,775,624 B2 | 8/2004 | Storino | |
| 7,581,201 B2 | 8/2009 | Kazda et al. | |
| 8,156,393 B2 | 4/2012 | Nagadomi et al. | |
| 8,248,095 B2 * | 8/2012 | Noorlag et al. | 324/762.01 |
| 2005/0188230 A1 | 8/2005 | Bilak | |

(Continued)

FOREIGN PATENT DOCUMENTS

WO    WO 2008066058 A1    6/2008

OTHER PUBLICATIONS

Kim et al.; Silicon Odometer: An On-Chip Reliability Monitor for Measuring Frequency Degradation of Digital Circuits; IEEE Journal of Solid State Circuits; Apr. 2008; pp. 874-880; vol. 43, No. 4; IEEE.

(Continued)

*Primary Examiner* — Lincoln Donovan
*Assistant Examiner* — Jung H Kim

(57) ABSTRACT

An electronic device comprises a first component susceptible to a wearout effect, operation of which first component depends on an operating parameter, and a second component having an on-state and an off-state. The electronic device further comprises a time estimator for updating an estimate of an accumulated time the second component was in the on-state; and a controller for controlling the operating parameter on the basis of the accumulated time estimate so as to respond to the expected wearout effect. The first component and the second component may be the same, or the first component may have an on-state correlated to the on-state of the second component. The operating parameter may, for example, be a level or amplitude or correction value of one of the following: a voltage applied at the first component, an electric current fed to the first component, and a power provided to the first component. A method of operating such an electronic device is also disclosed.

19 Claims, 5 Drawing Sheets

(56) References Cited

U.S. PATENT DOCUMENTS

| | | |
|---|---|---|
| 2006/0049886 A1* | 3/2006 | Agostinelli et al. .......... 331/175 |
| 2007/0132523 A1* | 6/2007 | Newman ....................... 331/175 |
| 2008/0036487 A1 | 2/2008 | Bradley et al. |
| 2008/0116455 A1* | 5/2008 | Jain et al. ......................... 257/48 |
| 2008/0186049 A1* | 8/2008 | Valentian ........................ 326/16 |
| 2009/0160515 A1 | 6/2009 | Warnock |
| 2009/0190413 A1 | 7/2009 | Hsu et al. |

OTHER PUBLICATIONS

International Search Report and Written Opinion correlating to PCT/IB2009/054942 dated Jul. 30, 2010.

* cited by examiner

RESPONSE TO WEAROUT IN AN ELECTRONIC DEVICE

FIELD OF THE INVENTION

This invention relates to an electronic device comprising a first component susceptible to a wearout effect, operation of which first component depends on an operating parameter; and a second component having an on-state and an off-state.

The invention also relates to a method of operating such an electronic device.

BACKGROUND OF THE INVENTION

Electronic devices and in particular semiconductor devices are often known to be susceptible to wearout effects. A wearout effect in this context is understood to be any long-term variation of the properties of the electronic device that is produced by operating the device. Examples of such wearout phenomena include negative bias temperature instability (NBTI), time-dependent dielectric breakdown (TDDB), hot carriers injection (HCI), and electromigration (EM). Although the mechanisms behind these phenomena are not necessarily fully understood, they are of practical importance, since they may require adapting operating parameters of the electronic device during the lifetime of the device.

For example, wearout effects may manifest themselves by an increase of latency in integrated circuits during the lifetime of the integrated circuit. US 2008/0036487 A1 therefore proposes detecting signal generation latency and generating a wearout response. The wearout response can take a variety of different forms such as reducing the operating frequency, increasing the operating voltage, and others.

SUMMARY OF THE INVENTION

The present invention provides an electronic device and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
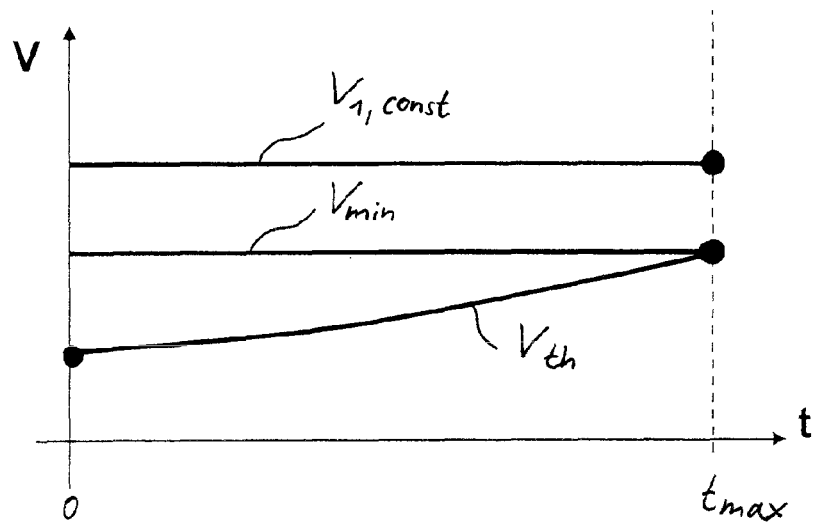
FIG. 1 shows a schematic plot of a threshold voltage and an operating voltage as functions of time.

Referring to FIG. 1, there is illustrated, by way of example, a threshold voltage $V_{th}$ of a semiconductor device, e.g. a transistor, as a function of an accumulated time t. The accumulated time t is understood to be the total time during which the device was in an on-state since e.g. fabrication or first use of the device. The threshold voltage $V_{th}$ is the minimum voltage required for operating the device. In the example, the threshold voltage $V_{th}$ increases monotonically as a function of the accumulated time t. This behaviour is a typical wearout effect of negative bias temperature instability (NBTI). Other wearout phenomena may result in similar or in different variations of the threshold voltage. In order to operate the device during a specified time interval $[0, t_{max}]$, where $t_{max}$ may represent the lifetime of the device, a constant voltage $V_{1, const}$ may be applied at the device. The constant voltage $V_{1, const}$ is chosen greater than a constant minimum voltage $V_{min}$. The minimum voltage $V_{min}$ is given by the threshold voltage $V_{th}$ at accumulated time $t_{max}$.

For a given type of device, the wearout behaviour of the threshold voltage $V_{th}$, i.e. the function $V_{th}(t)$, may be known or can be determined, e.g. experimentally. For example, a method of determining NBTI of a p-channel metal-oxide-semiconductor (PMOS) transistor is described in US 2003/0231028 A1.

Figure 2:
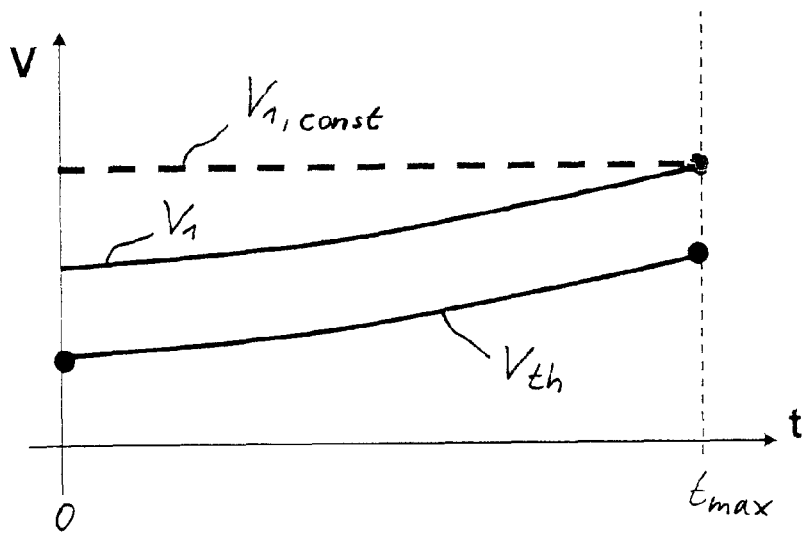
FIG. 2 shows a schematic plot of the threshold voltage and an adapted operating voltage as functions of time.

Alternatively, instead of providing a constant operating voltage $V_{1, const}$, the operating voltage can be adapted to the wearout behaviour of the threshold voltage $V_{th}$. This is illustrated with reference to FIG. 2. The operating voltage $V_1$ shown therein is controlled as a function of the actual or expected threshold voltage $V_{th}$ according to $V_1(t)=V_{th}(t)+\Delta V$ where $\Delta V$ is a constant safety margin. The operating voltage $V_1$ thus increases monotonically as prescribed by the threshold voltage $V_{th}$. As a consequence, the time-dependent operating voltage $V_1$ is lower than the constant operating voltage $V_{1, const}$ described above with reference to FIG. 1. A reduction in power consumption during the lifetime of the device can thus be achieved.

It is expected that other applications exist in which an operating parameter (for example, but not necessarily, a voltage) can be advantageously adapted in response to an expected wearout effect. In particular there may be such other applications in which no reduction in power consumption is achieved.

Figure 3:
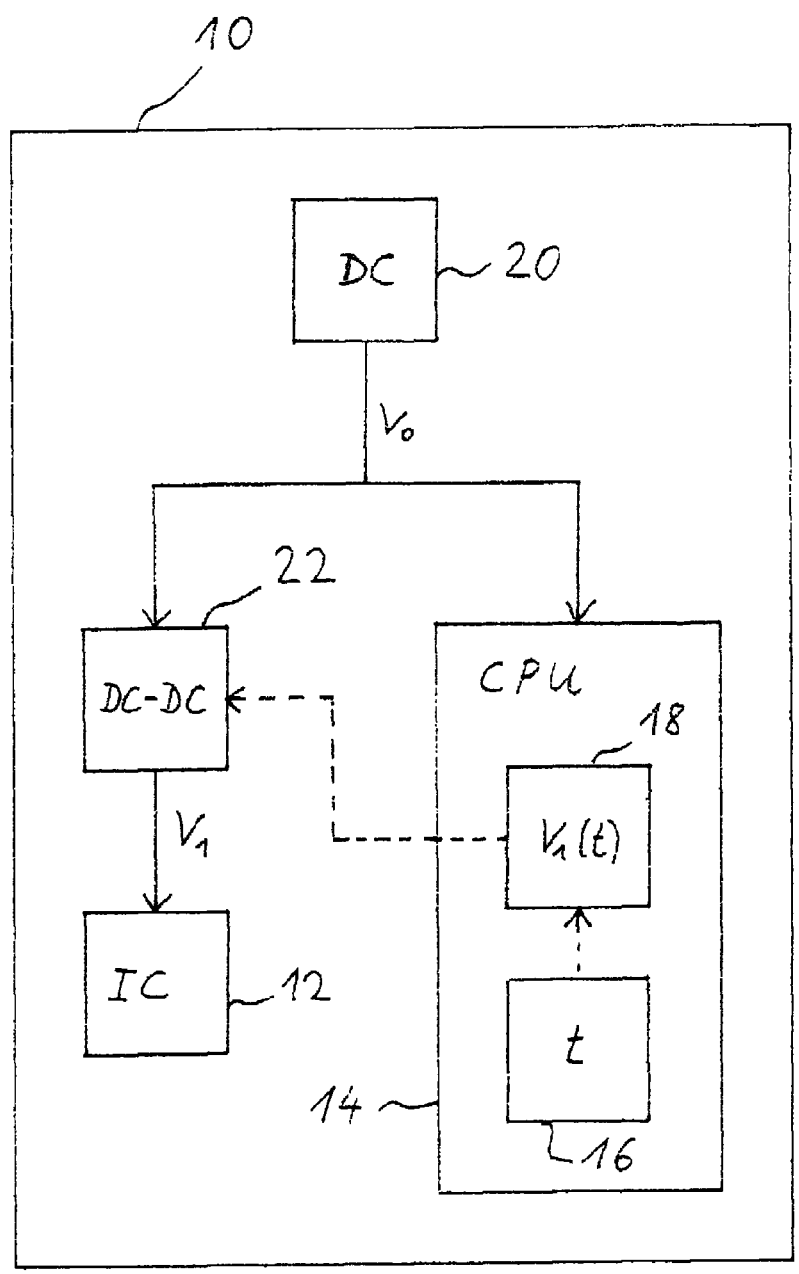
FIG. 3 shows a schematic outline of an electronic device according to a first embodiment.

Referring now to FIG. 3, there is illustrated an example of an electronic device 10 according to a first embodiment. The electronic device 10 may, for example, be one of the following: an integrated circuit, a microprocessor, a computer processor, a telephone, a navigation device (10), an audio device (10), a video device (10), and any combination thereof.

The device 10 comprises a first component 12, a second component 14, a time estimator 16, a controller 18, a DC voltage provider 20, and a DC-DC converter 22. In the example, the first component 12 is an integrated circuit, while the second component 14 is a central processing unit (CPU). The CPU may also be an integrated circuit. In the example, the second component 14 comprises the time estimator 16 and the controller 18. The time estimator 16 and the controller 18 are not necessarily distinct components of the CPU 14, indeed they may represent functionalities of the CPU 14. They may be implemented by dedicated circuitry and/or by software stored in a memory (not shown) of the CPU 14. The DC power provider 20 may be a battery. It provides a constant supply voltage $V_0$ for powering both the CPU 14 and the DC-DC voltage converter 22. The DC-DC voltage converter 22 generates an operating voltage $V_1$ for powering the integrated circuit 12. Operation of the first component 12 thus depends on an operating parameter, namely, the operating voltage $V_1$.

The first component 12 is susceptible to a wearout effect. The wearout effect may be due to at least one of the following phenomena: negative bias temperature instability (NBTI), time-dependent dielectric breakdown (TDDB), hot carriers injection (HCI), and electromigration (EM). Because of the expected wearout effect, adapting the operating parameter $V_1$ during the lifetime of the device 10 may be advantageous. The following solution is proposed, wherein it is assumed that the second component 14 has an on-state and an off-state. An on-state is a state in which the device in question (here, the second component), is "on" in the sense of "switched on" or "powered" or "active". An off-state is a state in which the device in question is "off" in the sense of "switched off" or "inactive" or "not powered". The electronic device 10 comprises a time estimator 16 for updating an estimate of an accumulated time the second component 14 was in the on-state. Restated in a simplified manner, the time estimator counts the total time during which the second device is in the on-state. The electronic device 10 further comprises a controller 18 for controlling the operating parameter (in the example, the voltage $V_1$) on the basis of the accumulated time estimate so as to respond to the expected wearout effect. It is pointed out that the wearout effect itself is not necessarily detected or determined.

The first component 12 may have an on-state correlated to the on-state of the second component 14. More particularly, the electronic device 10 may be such that when the second component 14 is in its on-state, the first component 12 has a probability greater than 50% of being in its on-state. In this case the estimate of the accumulated time the second component 14 was in the on-state may be a particularly reliable estimate of an accumulated time the first component 12 was in the on-state.

In the example shown, the controller 18 is configured for increasing the voltage $V_1$ as a function of the accumulated time estimate. Alternatively, the operating parameter may be a voltage correction applied at the first component 12, and the controller 18 may be configured for increasing the voltage correction as a function of the accumulated time estimate. More generally, the operating parameter may be a level or amplitude or correction value of one of the following: a voltage applied at the first component 12, an electric current fed to the first component 12, and a power provided to the first component 12.

In the example, the electronic device 10 comprises a clock generator (not shown) for generating a clock signal. The clock signal is periodic and has a clock period $T\_clk=1/f\_clk$ where $f\_clk$ is the clock frequency. The time estimator 16 comprises a counter (not shown) which is triggered by the clock signal. The counter has a range of at least $t\_max/T\_clk$, where the time $t\_max$ is one of the following: one week, one month, three months, one year, three years, ten years, thirty years, and a hundred years. The counter may thus be configured for counting during the entire lifetime without wrapping around to zero. Furthermore, the electronic device 10 may be configured such that the accumulated time estimate is conserved while the electronic device is not powered. To this end, the time estimator 16 may comprise a non volatile memory for memorizing the accumulated time estimate. The non-volatile memory may be, for example, a flash memory or an EEPROM. The counter may, for example, be provided by a dedicated counter, e.g. a Secure Real Time Counter (SRTC), in an always-on power domain, or by a dedicated counter coupled to a chip or external memory (e.g. flash memory) for memorizing the count, or by a software counter coupled to a chip or external memory (e.g. flash memory) for memorizing the count.

In an exemplary embodiment, the electronic device 10 does not comprise any means for resetting the accumulated time estimate. Furthermore, the electronic device 10 may comprise verification means for verifying whether the accumulated time estimate provided by the time estimator 16 is to be trusted. This can be relevant in view of possible attempts by hackers of resetting a system clock, e.g. a Secure Real Time Counter (SRTC). Such attempts may aim at violating Digital Rights Management (DRM). If the time estimator 16 depends on the SRTC, the accumulated time estimate might be reset by resetting the SRTC. The verification means may comprise a fuse (not shown) that is likely to be blown when a voltage is applied to the time estimator 16. Software can check the state of the fuse (blown or not blown) before working with the accumulated time estimate.

In the example, the controller 18 comprises a non-volatile memory (not shown) containing data for enabling the controller 18 to determine a nominal value of the operating parameter on the basis of the accumulated time estimate. The data may be provided in the form of, for example, a digital look-up table or a software definition of a mathematical function, e.g. a polynomial or exponential. The controller 18 then controls the DC-DC voltage converter 22 to output an operating voltage $V_1$ substantially equal to the nominal value determined by the controller 18. According to a specific embodiment, the controller 18 checks the accumulated time estimate at regular intervals. Depending on the clock period $T\_clk$, those intervals may be considerably larger than the clock period $T\_clk$.

In the present example, the electronic device 10 further comprises a temperature recorder (not shown) for recording values of a temperature of the electronic device 10. Controller 18 is configured for controlling the operating parameter on the basis of both the accumulated time estimate and the recorded temperature values so as to respond to the expected wearout. The operating voltage $V_1$ (or more generally, the operating parameter) can thus be controlled on the basis of a "history" of the temperature. The temperature recorder may comprise a sensor in thermal contact with the first component 12.

More generally, it is noted that a physical quantity may have an influence on the wearout effect. The electronic device 10 may therefore comprise a recorder for chronologically recording values of the physical quantity, and the controller 18 may be configured for controlling the operating parameter on the basis of both the accumulated time estimate and the recorded values of the physical quantity so as to respond to the expected wearout effect. The physical quantity may, for example, be a voltage, a frequency, or a temperature.

Figure 4:
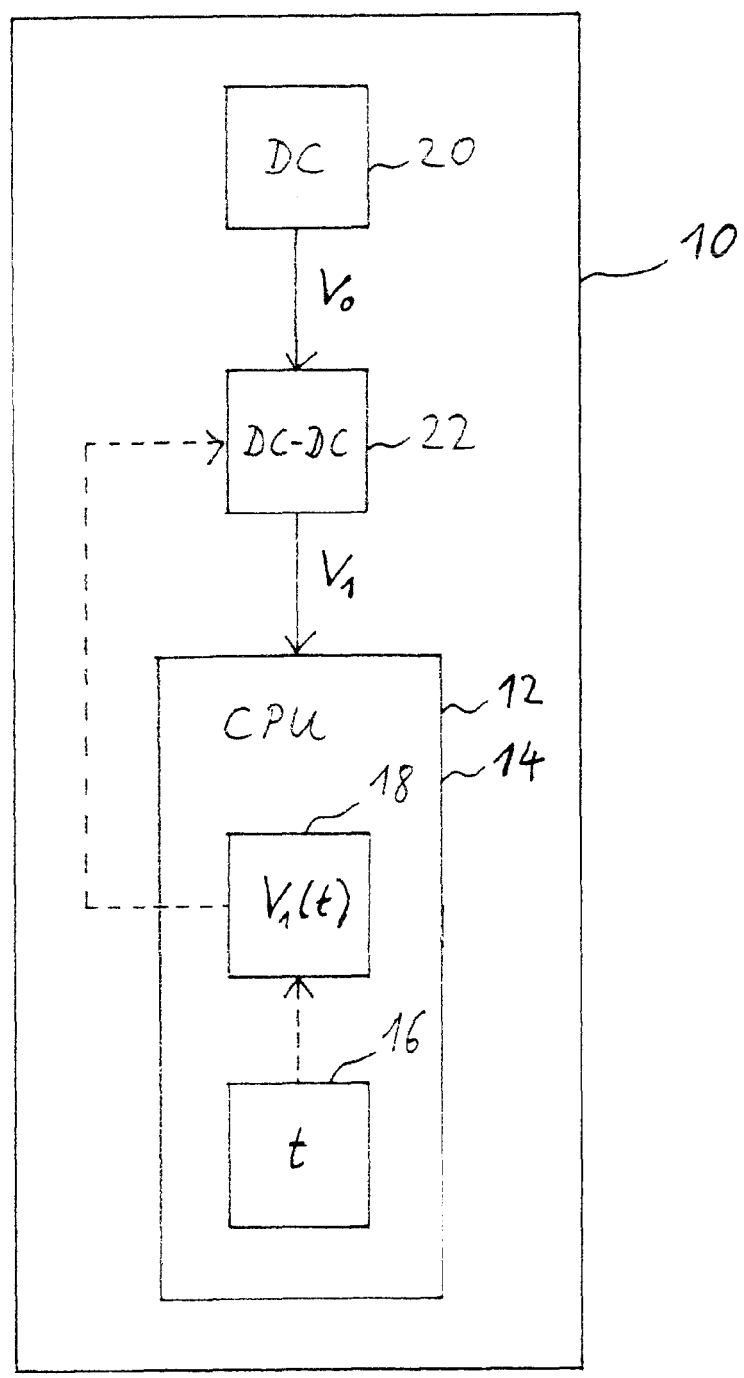
FIG. 4 shows a schematic outline of an electronic device according to a second embodiment.

Referring now to FIG. 4, there is shown an electronic device 10 in accordance with a second embodiment. It differs substantially from the electronic device 10 discussed above with reference to FIG. 3 only in that the first component 12 and the second component 14 are the same. In the example, it is thus the CPU 14 which is susceptible to a wearout effect, and the time estimator 16 provides an estimate of the accumulated time the CPU 12 is in an on-state. Based on the accumulated time estimate, the controller 18 determines a corresponding nominal voltage $V_1(t)$ which is applied to the CPU 12 by the DC-DC converter 22. In both the first and the second embodiments, the dependence of the nominal voltage $V_1$ on the accumulated time t may be predefined as a function of the expected wearout effect.

Figure 5:
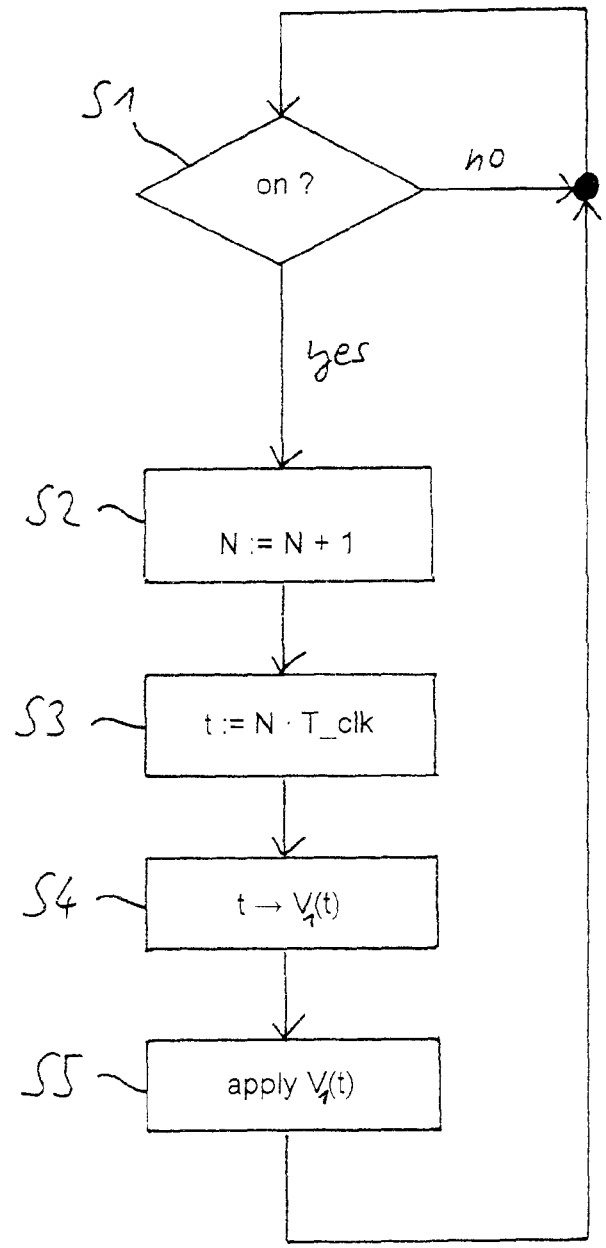
FIG. 5 is a schematic flow chart of a method of adapting an operating voltage.
Figure 6:
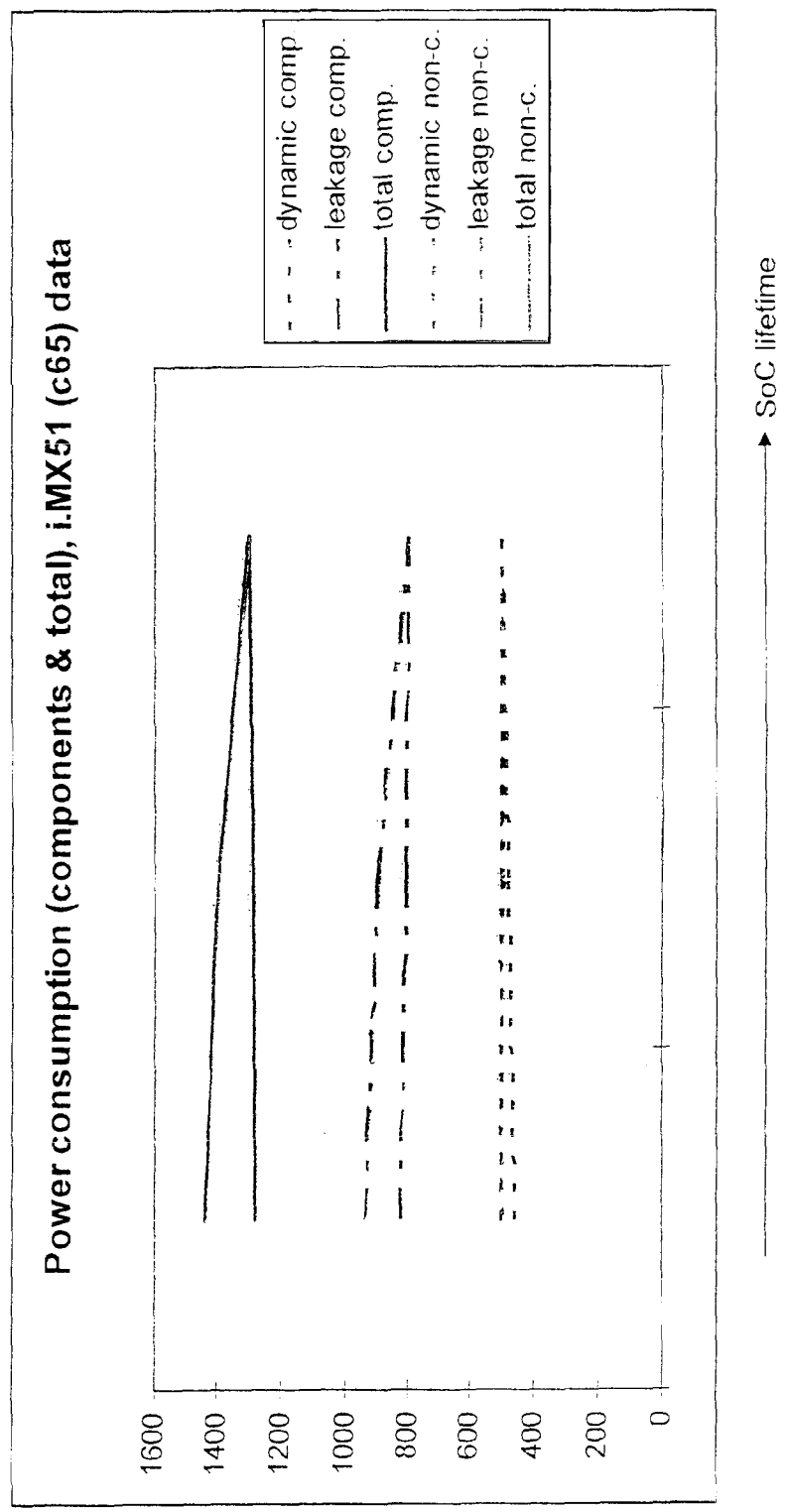
FIG. 6 shows a schematic plot of experimental data illustrating a reduction in power consumption.

Referring now to FIG. 5, a method of operating an electronic device 10 as discussed above with reference to FIGS. 3 and 4 comprises: providing an estimate of an accumulated time the second component 14 was in the on-state; and controlling the operating parameter on the basis of the accumulated time estimate so as to respond to the expected wearout effect. If the second device 14 is in its on-state (step S1), a counter in the time estimator advances by one (step S2). An accumulated time estimate t is determined as t:=N·T_clk (step S3). Based on the accumulated time estimate t thus determined, a nominal voltage $V_1(t)$ is determined (step S4). The nominal voltage $V_1(t)$ may be a predefined function of t. In subsequent step S5, the thus determined voltage $V_1(t)$ is applied at the first component 12. The process then returns to step S1. FIG. 6 presents data taken from i.MX51 measurements on a system on a chip. The total power consumed by the device is the sum of a dynamic power and a leakage power. Graphs 602, 606, and 610 in the plot refer respectively to the total power, the leakage power, and the dynamic power measured in an approach in which the operating voltage (supply voltage) was kept fixed at a high level corresponding to the required minimum voltage near the end of the lifetime of the device ("non-compensated approach"). Graphs 604, 608, and 612 analogously indicate, respectively, the total power, the leakage power, and the dynamic power in an approach in which the supply voltage was adapted as a function of an estimated accumulated time as described above with reference to FIGS. 2 to 5 ("compensated approach"). In both approaches, the power follows from a fifty millivolt supply voltage elevation (1.05 volt to 1 volt) required to meet reliability considerations. The dynamic power was obtained from Dhrystone benchmark measurements in a range of 1.05 volt to 1 volt in the compensated approach and at 1 volt in the non-compensated approach. The leakage power was determined at a fast process corner (ff corner) of a 125 degrees Celsius junction (automotive) with an assumed 15% leakage current due to aging or wearout processes. Clearly, the compensated approach results in reduced power consumption as compared to the compensated approach.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

While the operating parameter in the embodiments described above is a voltage, the invention is readily applicable to other types of operating parameters, such as electric current, power, electric capacity, and inductivity.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 3 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, controller 18 may be located on a same integrated circuit as components 12 and 14 or on a separate integrated circuit or located within another peripheral or slave discretely separate from other elements of system 10. Voltage provider 20 and DC-DC voltage converter 22 may also be located on separate integrated circuits or devices. Also for example, system 10 or portions thereof may be soft or code representations of physical circuitry or of logical representations convertible into physical circuitry. Thus, system 10 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electronic device comprising
    a first component susceptible to a wearout effect, operation of which first component depends on an operating parameter;
    a second component having an on-state and an off-state;
    a time estimator for updating an estimate of an accumulated time the second component was in the on-state;
    a recorder for chronologically recording values of a physical quantity, wherein the physical quantity has an influence on the wearout effect: and
    a controller for controlling the operating parameter on the basis of both the accumulated time estimate and the recorded values of the physical quantity so as to respond to the expected wearout effect.

2. The electronic device as set forth in claim 1, wherein the first component and the second component are the same, or the first component has an on-state correlated to the on-state of the second component.

3. The electronic device as set forth in claim 1, wherein the operating parameter is a level or amplitude or correction value of one of the following: a voltage applied at the first component, an electric current fed to the first component, and a power provided to the first component.

4. The electronic device as set forth in claim 1, wherein the operating parameter is a voltage or voltage correction applied at the first component, and the controller is configured for increasing the voltage or voltage correction as a function of the accumulated time estimate.

5. The electronic device as set forth in claim 1, wherein the time estimator comprises a counter for being triggered by a clock signal.

6. The electronic device as set forth in. claim 5, wherein the electronic device comprises a clock generator for generating the clock signal, the clock signal having a clock period T_clk, and the counter having a range of at least t_max/T_clk, where the time t_max is one of the following: one week, one month, three months, one year, three years, ten years, thirty years, and a hundred years.

7. The electronic device as set forth in claim 1, configured such that the accumulated time estimate is conserved while the electronic device is not powered.

8. The electronic device as set forth in claim 1, wherein the time estimator comprises a non-volatile memory for memorizing the accumulated time estimate.

9. The electronic device as set forth in claim 1, wherein the electronic device does not comprise any means for resetting the accumulated time estimate.

10. The electronic device as set forth in claim 1, wherein the controller comprises a non-volatile memory containing data for enabling the controller to determine a nominal value of the operating parameter on the basis of the accumulated time estimate.

11. The electronic device as set forth in claim 1, wherein the wearout effect is due to at least one of the following phenomena: negative bias temperature instability (NBTI), time-dependent dielectric breakdown, hot carriers injection, and electromigration.

12. The electronic device as set forth in claim 1, wherein the electronic device is configured for being powered by a battery.

13. The electronic device as set forth in claim 1, wherein the electronic device is one of the following: an integrated circuit, a microprocessor, a computer processor, a telephone, a navigation device, an audio device, a video device, and any combination thereof.

14. A method of operating an electronic device, wherein the electronic device comprises
    a first component susceptible to a wearout effect, operation of which first component depends on an operating parameter; and
    a second component having an on-state and an off-state; wherein the method comprises providing an estimate of an accumulated time the second component was in the on-state;
        chronologically recording values of a physical quantity, wherein the physical quantity has an influence on the wearout effect; and
        controlling the operating parameter on the basis of both the accumulated time estimate and the recorded values of the physical quantity so as to respond to the expected wearout effect.

15. The method as set forth in claim 14, wherein the first component and the second component are the same, or the first component has an on-state correlated to the on-state of the second component.

16. The method as set forth in claim 14, wherein the operating parameter is a level or amplitude or correction value of one of the following: a voltage applied at the first component, an electric current fed to the first component, and a power provided to the first component.

17. The method as set forth in claim 14, wherein the operating parameter is a voltage or voltage correction applied at the first component, and controlling the operating parameter comprises increasing the voltage or voltage correction as a function of the accumulated time estimate.

18. The method as set forth in claim 14, wherein the time estimator comprises a counter for being triggered by a clock signal.

19. The method as set forth in claim 18, wherein the electronic device comprises a clock generator for generating the clock signal, the clock signal having a clock period T_clk, and the counter having a range of at least t_max/T_clk, where the time t_max is one of the following: one week, one month, three months, one year, three years, ten years, thirty years, and a hundred years.

* * * * *